United States Patent [19]

Doyle

[11] Patent Number: 4,682,057

[45] Date of Patent: Jul. 21, 1987

[54] CIRCUIT DESIGN TECHNIQUE TO PREVENT CURRENT HOGGING WHEN MINIMIZING INTERCONNECT STRIPES BY PARALLELING STL OR ISL GATE INPUTS

[75] Inventor: Brent R. Doyle, Indialantic, Fla.

[73] Assignee: Harris Corporation, Melbourne, Fla.

[21] Appl. No.: 301,761

[22] Filed: Sep. 14, 1981

[51] Int. Cl.[4] .......... H03K 19/091

[52] U.S. Cl. .......... 307/459; 307/443; 307/446; 307/458; 307/477

[58] Field of Search .......... 307/443, 446, 457–459, 307/477, 299 A, 299 B

[56] References Cited

U.S. PATENT DOCUMENTS

| | | | |
|---|---|---|---|
| 3,918,004 | 11/1975 | Shimizu et al. | 307/299 A X |
| 4,129,790 | 12/1978 | Gani et al. | 307/458 X |
| 4,165,470 | 8/1979 | Fulkerson | 307/458 X |
| 4,288,805 | 9/1981 | Depey | 307/458 X |

OTHER PUBLICATIONS

Taub and Schilling, *Digital Integrated Electronics,* McGraw–Hill, Inc., New York, 1977, pp. 164–169.

*Primary Examiner*—Stanley D. Miller
*Assistant Examiner*—D. R. Hudspeth
*Attorney, Agent, or Firm*—Barnes & Thornburg

[57] ABSTRACT

An STL or ISL logic circuit comprising a plurality of single-input, multiple-output logic gates is provided. Each of these gates has a current source and a transistor including a base, emitter and multiple Schottky diode-to-collector contacts. The bases of the logic gate transistors are tied together to minimize metal interconnect stripes when a fanout greater than that of one gate is needed. Current hogging is reduced by an ohmic collector contact with connects the collector of each transistor together.

10 Claims, 4 Drawing Figures

74
VBB
VBB
VBB
IN
68
70
72
62
64
66

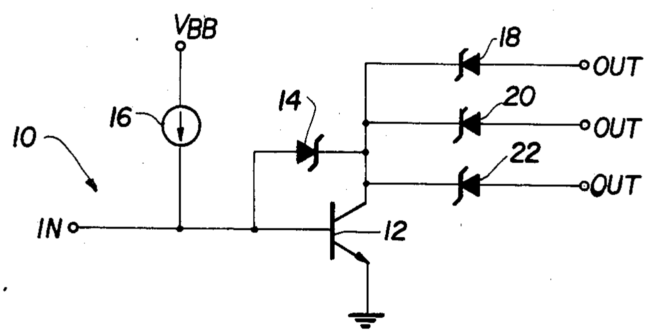
FIG.1
PRIOR ART
FIG.2
PRIOR ART
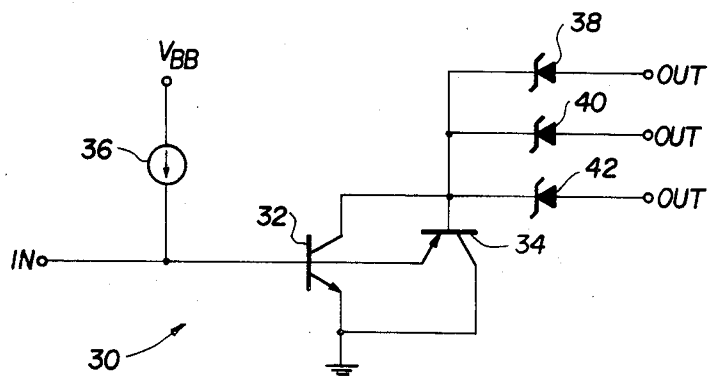
FIG.3
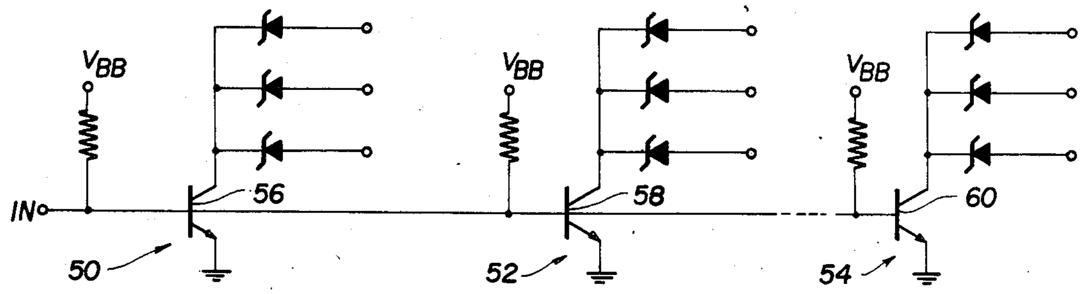
FIG.4
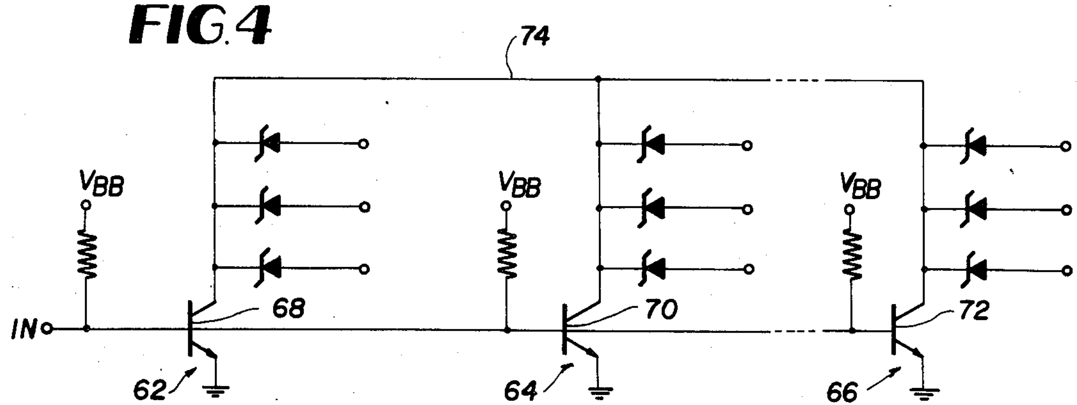

CIRCUIT DESIGN TECHNIQUE TO PREVENT CURRENT HOGGING WHEN MINIMIZING INTERCONNECT STRIPES BY PARALLELING STL OR ISL GATE INPUTS

BACKGROUND OF THE INVENTION

The present invention is generally related to integrated logic circuits and, more particularly, to an improved circuit design technique for Schottky transistor logic (STL) and integrated Schottky logic (ISL).

Low-power Schottky transistor-transistor logic (TTL) and integrated injection logic ($I^2L$) gates are well-known integrated circuits which can be easily produced. Although $I^2L$ has several advantages, the foremost being its high packing density and low power consumption, its speed is often too slow for many applications. In contrast, low power Schottky TTL is characterized by high speed performance but high power consumption and low packing density. The performance gap created by these two logic families led recently to the development of STL and ISL.

STL, as illustrated in FIG. 1, is a non-saturating bipolar circuit form wherein each gate is a single-input, multiple-output inverter which includes a clamping Schottky diode between the base and collector of the NPN transistor used in the gate. In order for the STL gate to provide a logic swing, however, the Schottky diodes in the gate output circuit must have a different barrier height than that of the clamping Schottky diode. STL gates are, therefore, not easily made by standard fabrication techniques which utilize only one type of Schottky diode.

ISL, as illustrated in FIG. 2, is a saturating bipolar circuit form wherein each gate is a single-input, multiple-output inverter wherein the Schottky clamping diode of STL is replaced by a somewhat slower, silicon clamp device, such as a PNP transistor. Although ISL gates are not as fast as STL gates, the devices can be easily fabricated using existing processes. Both types of Schottky logic gates, however, are much faster than $I^2L$ and have higher packing densities and lower power consumption than Schottky TTL.

A problem arises, however, in the use of STL or ISL circuit designs when it becomes desirable to tie individual gate inputs to a common line, as illustrated in FIG. 3. This interconnection may be required to increase fan-out or reduce the number of metal interconnect stripes used in the circuit. However, when the STL or ISL gate inputs are tied together, severe current hogging and logic faults readily occur, making the design impractical. Therefore, initial attempts at using STL or ISL with a common-base connection have been unsuccessful.

OBJECTS OF THE INVENTION

It is, therefore, an object of the present invention to provide a circuit design technique for paralleled STL and ISL gates wherein current hogging is minimized.

It is another object of the present invention to provide a circuit design technique for STL and ISL gates which minimizes the number of total interconnect stripes required when the gate inputs are paralleled.

It is yet another object of the present invention to provide a current design technique for STL and ISL gates which prevents logic faults.

It is still another object of the present invention to provide a STL and ISL circuit design technique which is inexpensive and readily incorporated into existing manufacturing processes.

These and other objects are attained by providing a STL or ISL logic circuit comprising a plurality of single-input, multiple-output logic gates each having a transistor including a base, emitter, and multiple Schottky diode-to-collector contacts. The bases of the plurality of transistors are tied together when desired to minimize circuit interconnect stripes. A contact means interconnecting the collectors of the plurality of gates is provided for reducing current hogging between the bases of the transistors when the logic gates have unequal loading. This contact means is an ohmic collector contact which connects the collector of each of the transistors together.

BRIEF DESCRIPTION OF THE DRAWINGS

FIG. 1 shows a single prior art STL gate.

FIG. 2 shows a single prior art ISL gate.

FIG. 3 shows a plurality of ISL gates connected together in a common-base structure which is subject to current hogging.

FIG. 4 shows the plurality of ISL gates seen in FIG. 3 with the novel structure of the instant invention for preventing current hogging and minimizing metal interconnect stripes.

DESCRIPTION OF THE PREFERRED EMBODIMENTS

Referring now to FIG. 1, a standard STL gate 10 is shown in detail. More specifically, gate 10 comprises NPN transistor 12, Schottky clamp diode 14, current source 16, and Schottky output diodes 18, 20 and 22. The current source 16, which is typically a PNP transistor or a resistor, is connected to the base of the transistor 12 and to a supply source $V_{BB}$. The emitter of transistor 12 is grounded while its collector is common to the cathodes of output diodes 18, 20 and 22. The input to the STL gate 10 is provided at the base of the transistor 12 while the outputs thereof are provided at the anodes of Schottky diodes 18, 20 and 22. Note that three output terminals are specifically shown in FIG. 1, however, the gate 10 may be provided with more or less output terminals as desired. The Schottky clamp diode 14, connected between the base and collector of transistor 12, keeps this transistor out of saturation for high speed response. Gate 10 functions as a single-input, multiple-output non-saturating inverter.

FIG. 2 discloses a standard ISL gate 30 in detail. In particular, gate 30 comprises NPN transistor 32, PNP clamp transistor 34, current source 36, and Schottky output diodes 38, 40 and 42. As in STL, the current source 36 is either a PNP transistor or a resistor connected between the base of transistor 32 and $V_{BB}$. Similarly, the emitter of transistor 32 is grounded while its collector is common to the cathodes of Schottky output diodes 38, 40 and 42. The input to the ISL gate 30 is provided at the base of transistor 32 while the outputs thereof are provided at the anodes of diodes 38, 40 and 42. The STL clamp diode 14, seen in FIG. 1, is replaced by PNP clamp transistor 34 in FIG. 2, for providing clamping of transistor 32. Specifically, the base of clamp transistor 34 is common and formed by the collector of transistor 32, while its collector, formed by a P type isolation, is grounded. Also, the emitter of clamp transistor 34 is common with and formed by the base of transistor 32. In operation of the ISL gate 30, the transistor 32 does saturate as its base-collector junction, which is also the PNP emitter base junction, is forward biased. The majority of the holes being injected into the base of the PNP clamp transistor 34 are collected by its collector. The action of collecting holes results in fewer holes being stored in the PNP base (NPN collector) then would occur if the PNP were absent and, thus, faster switching speed is achieved. Gate 30 functions as a single-input, multiple-output saturating inverter.

It should be noted that although FIG. 2 shows ISL gate 30 with a PNP transistor 34 as the clamp, any other type of silicon clamp which keeps the transistor 32 mildly saturated could be used as well.

Turning now to FIG. 3, a plurality of ISL gates 50, 52 and 54 are shown with the clamping transistor of each gate omitted for clarity. These gates have a common base structure such that the gate inputs are in parallel. This type of interconnection may be required when an input signal must be fed to more places in the logic circuit than the fan-out of one ISL gate can supply, or it is desired to minimize the number of metal interconnect stripes used in the circuit. For example, this interconnection is practical for applying a clock signal to the ISL gates 50, 52 and 54. The use of the above common-base connection, however, gives rise to severe current hogging and, thus, logic faults in the circuit shown in FIG. 3. In particular, with the outputs of ISL gates 50, 52 and 54 unloaded the emitter current densities of the transistors 56, 58 and 60 are equal, assuming these transistors are substantially identical. However, should the various gates have different numbers of loaded outputs, then the gates with the smaller output loads will steal base current from the common-base interconnection in an attempt to maintain the matched emitter current densities between the paralleled base-emitter diodes of the transistors. Specifically, it should be noted that the collector currents of transistors 56, 58 and 60 are a function of the output loads thereon and, therefore, the base currents in the transistors must change to keep the emitter current densities matched. The stealing of base current from the common-base interconnection is the well-known current-hogging phenomenon. In particular, the gates with the larger loads will be robbed of base current by the gates with smaller loads.

Referring to FIG. 3 again, assume that gates 50 and 52 have all three of their outputs loaded while gate 54 has only one output loaded. In this case, transistors 56 and 58 of gates 50 and 52 will be robbed of base current by transistor 60 of gate 54. Therefore, transistors 56 and 58 of gates 50 and 52 will come out of their mildly-saturated state such that the emitter current densities of the transistors 56, 58 and 60 are equal. Once transistors 56 and 58 come out of saturation, their respective collector currents drop causing undesirable logic faults.

The novel solution to the current-hogging problem associated with the common-base ISL structure of FIG. 3 is shown in FIG. 4. In particular, FIG. 4 discloses common-base ISL gates 62, 64, and 66 which are driven by NPN transistors 68, 70 and 72, respectively. Note again, that the clamp transistor of each gate is omitted for clarity. The instant invention provides an improved structure for preventing current-hogging and minimizing metal interconnect stripes through the use of ohmic collector contact 74. More specifically, contact 74 connects the collectors of transistors 68, 70 and 72 together. Therefore, even if any of the gates 62, 64 or 66 have unequal output loads, the load current in the circuit will still be distributed equally throughout all of the output collectors by ohmic collector contact 74. Note that in the circuit of FIG. 3, the collector currents in the gate transistors are proportional to the number of output loads; however, once the contact 74 is used, the collector currents balance such that the base and emitter currents in the transistors are equal. Since the load current is now evenly distributed, the least-loaded gates do not rob base drive from the common-base conductor. Thus, the emitter current densities of the transistors 68, 70 and 72 remain matched without any of these transistors coming out of saturation.

The use of the ohmic collector contact 74 in the common-base ISL circuit of FIG. 4 thus prevents current-hogging which gives rise to logic faults. Since current-hogging is not a problem, the common-base structure of FIG. 4 becomes practical, therefore minimizing the number of metal interconnect stripes required by the circuit.

It should also be noted that, although FIGS. 3 and 4 disclose ISL, the instant invention is equally applicable to common-base STL gates as well, since STL is also susceptible to current-hogging. This is true even though the NPN transistor used in the individual STL gate is not saturated.

Although the invention has been described in detail, it is to be clearly understood that the same is by way of illustration and example only and is not to be taken by way of limitation, the spirit and scope of the invention being limited only to the terms of the appended claims.

What is claimed is:

1. A logic circuit, comprising:

a plurality of single-input, multiple-output logic gates each having a transistor including a base, emitter and collector, said single-input being applied to said base of said transistor, said multiple-outputs being taken from said collector of said transistor through Schottky diodes, said collector having an ohmic collector contact, said bases of said plurality of transistors being connected together and driven by a current source means, said emitters of said plurality of transistors being connected to a common potential node; and contact means interconnecting said ohmic collector contacts of said plurality of gates for reducing current hogging between the bsaes of said transistors when said logic gates have unequal load currents drawn by said multiple outputs.

2. A logic circuit as defined in claim 1, wherein said single-input, multiple-output logic gates are Schottky transistor logic gates.

3. A logic circuit as defined in claim 1, wherein said single-input, multiple-output logic gates are integrated Schottky logic gates.

4. A logic circuit as defined in claim 1 wherein said current source means is a constant current source applied to each of said gates.

5. A logic circuit as defined in claim 4, wherein said constant current source is a resistor connected to a source of supply voltage.

6. A logic circuit, comprising:

a plurality of single-input, multiple-output logic gates each having a transistor including a base, emitter and collector, said single-input being applied to said base of said transistor, said multiple-outputs being taken from said collector of said transistor through Schottky diodes, said collector having an ohmic collector contact, said bases of said plurality of transistor being connected together and driven by a current source means, said emitters of said plurality of transistors being connected to a common potential node; and contact means interconnecting said ohmic collector contacts for balancing the collector currents of said transistors irrespective of the current loading on said gates.

7. A logic circuit as defined in claim 6, wherein said single-input, multiple-output logic gates are Schottky transistor logic gates.

8. A logic circuit as defined in claim 6, wherein said single-input, multiple-output logic gates are integrated Schottky logic gates.

9. A logic circuit as defined in claim 6, wherein said current source means is a constant current source applied to each of said gates.

10. A logic circuit as defined in claim 9, wherein said constant current source is a resistor connected to a source of supply voltage.

* * * * *